United States Patent [19]

Lee

[11] Patent Number: 5,160,861
[45] Date of Patent: Nov. 3, 1992

[54] CIRCUIT FOR CONTROLLING THE OUTPUT OF A SENSE AMPLIFIER

[75] Inventor: Jeong-Woo Lee, Seoul, Rep. of Korea

[73] Assignee: SamSung Electronics Co., Ltd., Suweon, Rep. of Korea

[21] Appl. No.: 641,277

[22] Filed: Jan. 15, 1991

[30] Foreign Application Priority Data

Dec. 28, 1990 [KR] Rep. of Korea ............... 22263/1990

[51] Int. Cl.$^5$ ............................................... G11C 7/02
[52] U.S. Cl. ................................. 307/530; 365/206
[58] Field of Search ............... 307/350, 442, 443, 471, 307/530; 365/206, 207

[56] References Cited

U.S. PATENT DOCUMENTS 5,015,891 5/1991 Choi ..................................... 307/530

Primary Examiner—Steven Mottola
Attorney, Agent, or Firm—Robert E. Bushnell

[57] ABSTRACT

There is disclosed a circuit for controlling the output of a sense amplifier of a semiconductor memory in order to prevent the noises which may be induced by an I/O pad to the sense amplifier as well as to minimize the power consumption. The circuit includes a sense amplifier (600) for sensing and amplifying the data retrieved from a selected memory cell, an I/O pad, a data latch circuit (700) connected to the I/O pad, a sense amplifier output detector (670) for detecting the state of data pair outputted from the sense amplifier, a control signal generator (680) for receiving an address transition detection signal and the output of the sense amplifier output detector to generate a given control signal, and transfer transistors (650, 660) connected between the sense amplifier and the data latch circuit for responding to the output of the control signal generator.

18 Claims, 4 Drawing Sheets

| 605 | 606 | 607 |
|-----|-----|-----|
| 0 | 0 | -1 |
| 0 | 1 | 0 |
| 1 | 0 | 0 |
| 1 | 1 | 1 |

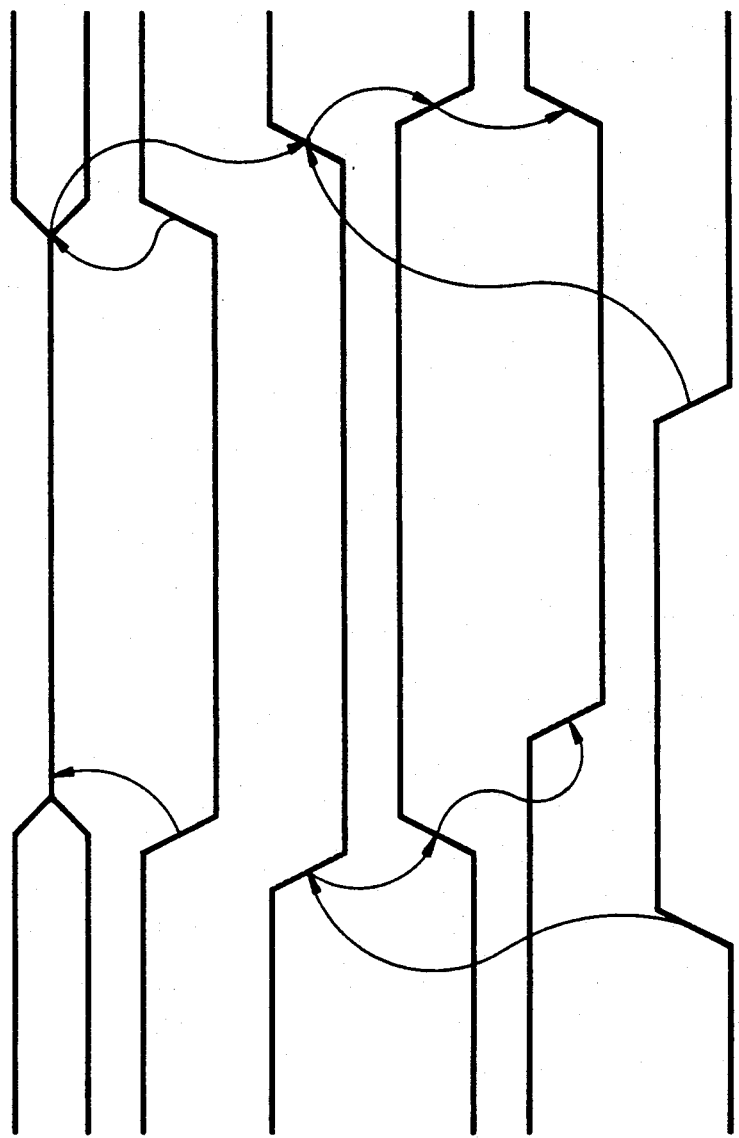

CIRCUIT FOR CONTROLLING THE OUTPUT OF A SENSE AMPLIFIER

BACKGROUND OF THE INVENTION

The present invention concerns a sense amplifier of a semiconductor memory, and particularly a circuit for optimizing the operation of the sense amplifier by controlling the output thereof.

Generally, a semiconductor memory includes a part for storing data (i.e., memory cell groups), a selecting part for selectively storing and/or reading out data into and/or from an addressed memory location (i.e., decoder), a part for sensing the signal state of the input-/output data (i.e., sense amplifier), and a part for passing the data (i.e., data bus). Presently, some of the important problems to solve concerning such a semiconductor memory are to make it have a large scale data storing capacity, improve operating speed thereof, and reduce the undesired power consumption.

Furthermore, the part for sensing the signal state of the input/output data, i.e., a sense amplifier, amplifies the data retrieved from a selected memory cell by means of voltage difference and then delivered to a data output buffer. Hence, the operating efficiency of the memory depends on whether the sense amplifier properly works within the optimum time or not.

Referring to FIG. 1 for schematically showing the construction of a conventional semiconductor memory, the address signals converted through the address buffer 200 into a CMOS level (i.e., logic high state is 5V and logic low state is 0V) are delivered to the row and column decoders 300 and 400, which select a memory cell of the memory cell array 100. The data retrieved from a selected memory cell is output through the sense amplifier 600, data latch circuit 700 and data output buffer 800 to the I/O pad 900. An address transition detector (ATD) for receiving the signal of the address buffer 200 detects the transition of the address signal so as to control the input/output of the sense amplifier 600 and the data latch circuit 700. The output signal of the ATD 500, i.e., address transition detection signal, is used to control the data lines between the sense amplifier 600 and the data latch circuit 700, as shown in FIG. 2.

Referring to FIG. 2, there are provided a pair of transfer PMOS transistors 63 and 64 in a pair of data lines 61 and 62, disposed between the sense amplifier 600 and the data latch circuit 700. The gates of the transfer transistors are connected with the output signal of the ATD 500.

In such a conventional system for controlling the output of the sense amplifier 600 by using the ATD 500, there may occur the following two problems.

First, in the event that the sense amplifier 600 is continuously enabled even after generation of the data, if data passes through the I/O pad 900, the voltage swing from logic "low" state to logic "high" state or vice versa in the I/O pad 900 causes noise which may affect the sense amplifier 600.

Second, in the event that the sense amplifier 600 is disabled by the ATD signal after the generation of data, since the sense amplifier 600 is in the active state during the lag between the data outputting and the disabling thereof, the reduction of power consumption during this lag is limited.

Consequently, the time point at which the sense amplifier produces output data must be separated from the time point at which the data is finally retrieved at the I/O pad, in order to prevent the noise which may be induced by the I/O pad 900 to the sense amplifier and reduce the power consumption during the operation of the sense amplifier 600.

SUMMARY OF THE INVENTION

It is therefore an object of the present invention to provide a circuit for controlling the output of a sense amplifier of a semiconductor memory so as to prevent the noises which may be induced by an I/O pad to the sense amplifier.

It is another object of the present invention to provide a circuit for controlling the output of the sense amplifier so as to minimize the power consumption.

According to the present invention, a semiconductor memory includes a sense amplifier for sensing and amplifying the data retrieved from a selected memory cell, an I/O pad, a data latch circuit connected with the I/O pad, a sense amplifier output detector for detecting the state of data pair outputted from the sense amplifier, a control signal generator for receiving an address transition detection signal and the output of the sense amplifier output detector to generate a given control signal, and transfer means connected between the sense amplifier and the data latch circuit for responding to the output of the control signal generator.

The present invention will now be described more specifically with reference to the drawings attached only by way of example.

BRIEF DESCRIPTION OF THE ATTACHED DRAWINGS

Figure 3:
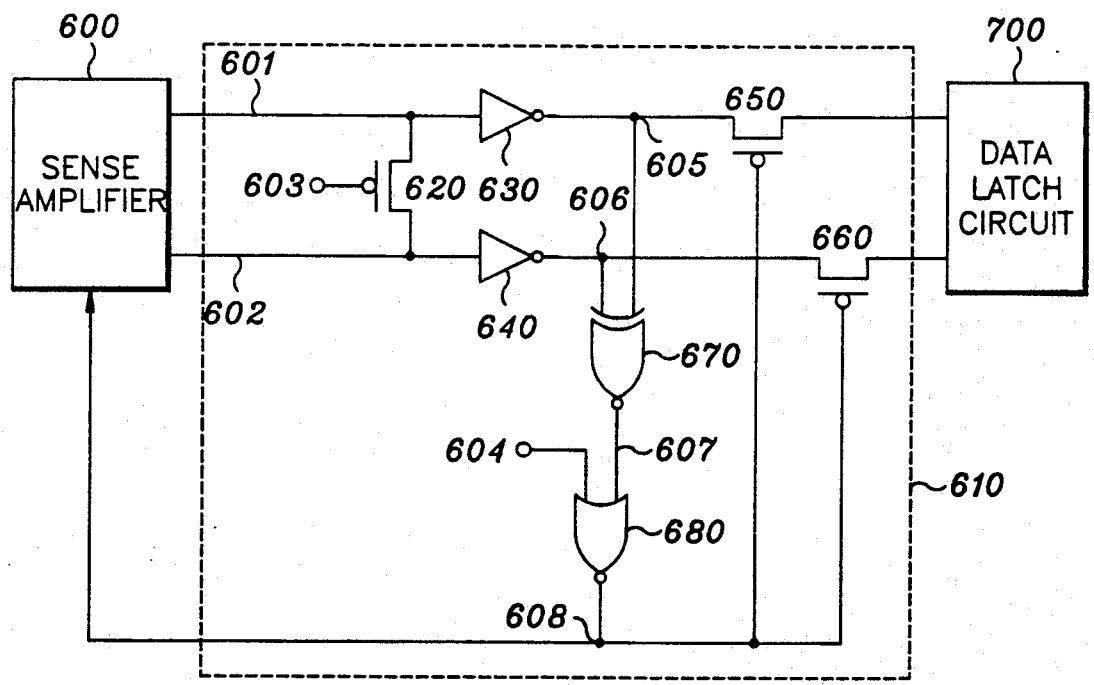
FIG. 3 illustrates the inventive circuit.
Figures 4A, 4B:
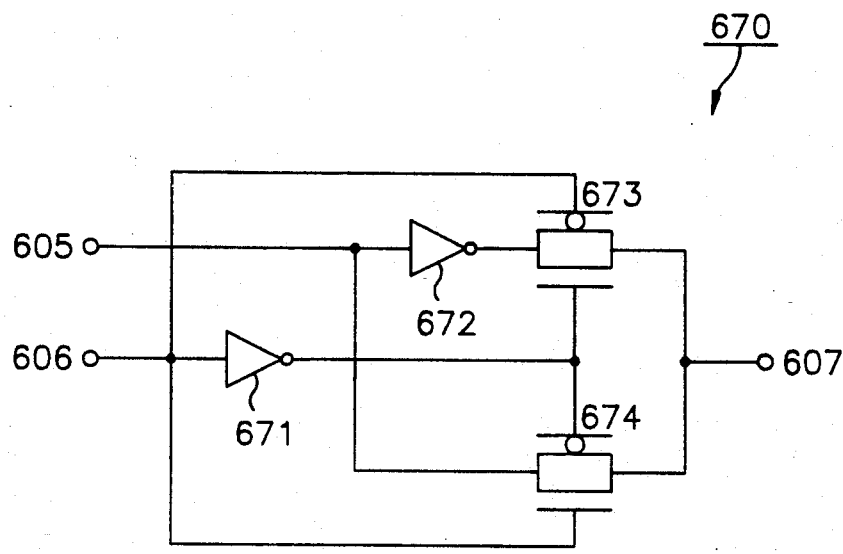

FIGS. 4A and 4B respectively show the internal circuit diagram of the exclusive OR gate in FIG. 3 and the truth table of the XNOR gate, respectively; and FIGS. 5A, 5B, 5C, 5D, 5E and 5F are timing diagrams of the operation of the inventive circuit.

DETAILED DESCRIPTION OF A CERTAIN PREFERRED EMBODIMENT

Figure 1:
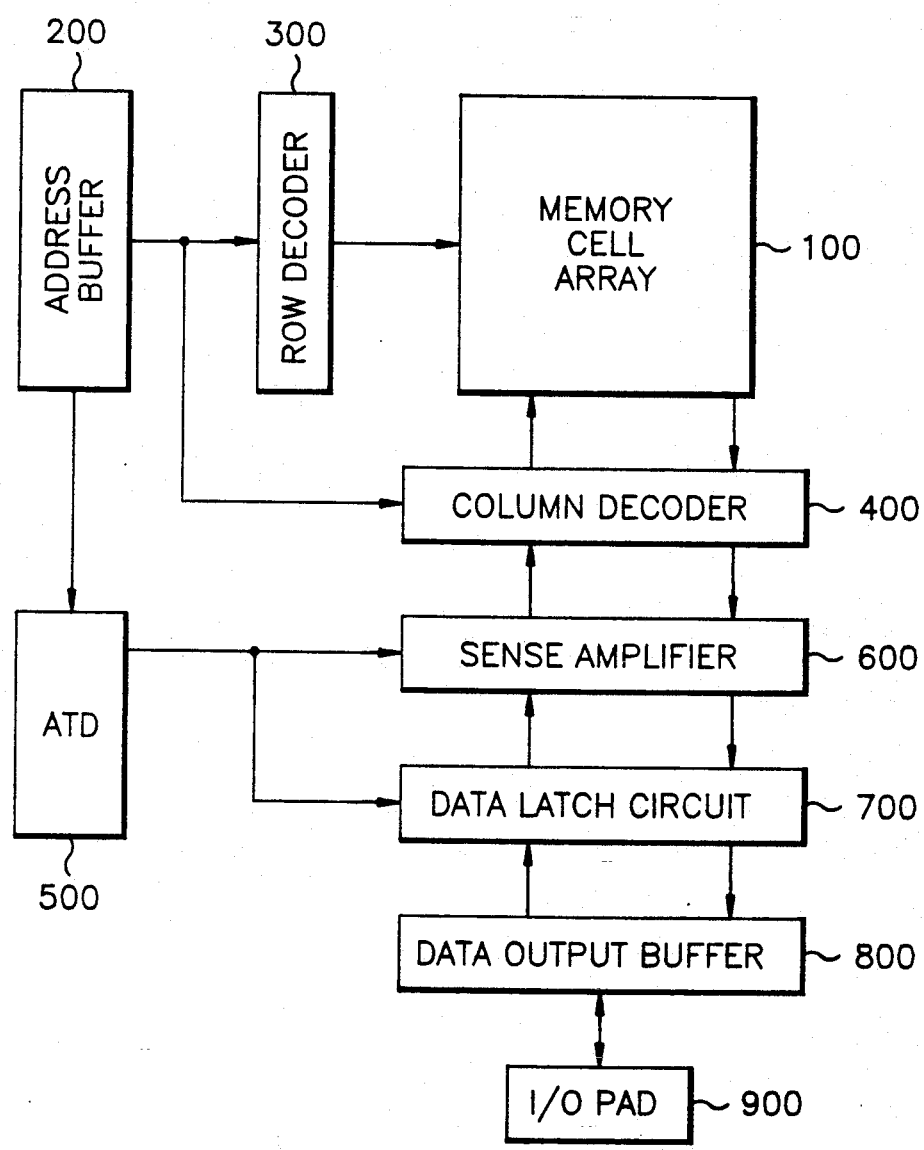
FIG. 1 is a block diagram for illustrating a general semiconductor memory.
Figure 2:
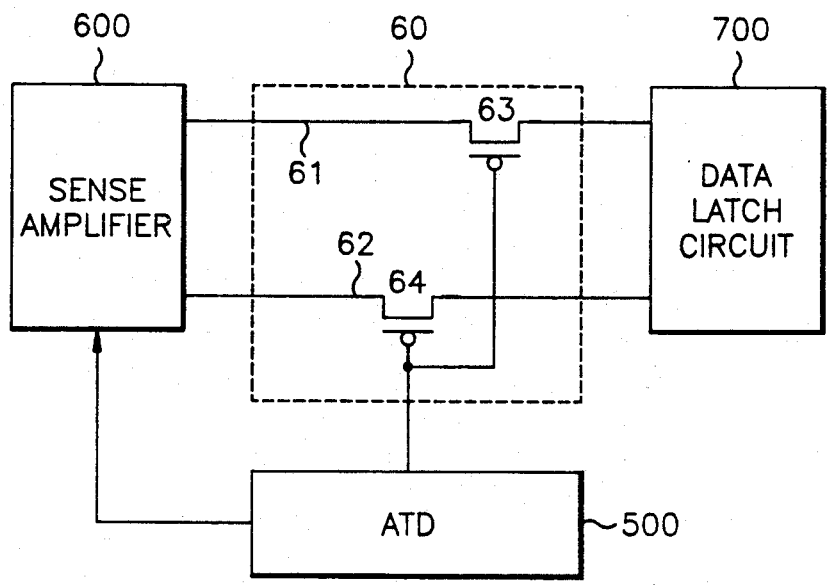
FIG. 2 is a circuit diagram for illustrating the conventional device for controlling the output of a sense amplifier.

FIG. 3 shows a sense amplifier output control circuit 610 for controlling the output of a sense amplifier 600 according to an embodiment of the present invention. The same reference numerals are used for the same parts of FIGS. 1 and 2. The sense amplifier output control circuit 610 is connected between the sense amplifier 600 and the data latch circuit 700.

Between a pair of data lines 601 and 602 of the sense amplifier output control circuit 610 is connected a PMOS transistor 620 for equalizing the data lines, whose gate is provided with a data line equalizing signal 603 that may be a signal used in a conventional semiconductor memory. The data lines 601 and 602 respectively have inverters 630 and 640, and transfer PMOS transistors 650 and 660.

A first connecting node 605 disposed between the inverter 630 and the transfer PMOS transistor 650 and a second connecting node 606 disposed between the inverter 640 and the transfer PMOS transistor 660 are coupled to each input terminal of an exclusive NOR gate (XNOR) 670. The output 607 of the XNOR gate 670 and an ATD signal 604 are respectively applied to a NOR gate 680, of which output 608 is delivered to the sense amplifier 600 and the gates of the transfer transistors 650 and 660.

Referring to FIGS. 4A and 4B for illustrating a detailed internal circuit diagram of the NOR gate 670 shown in FIG. 3 and the truth table according thereto, the XNOR gate works to alternately operate transmission gates 673 and 674 to constantly produce a signal of logic "1" state if both inputs 605 and 606 are uniformly at the logic "0" or "1" state, while producing a signal of logic "0" state only if the two inputs have different logic states.

Referring now to FIG. 5A, which represents the voltage states of the data lines 601 and 602 connected to the output of the sense amplifier 600, FIG. 5B the data line equalizing signal 603, FIG. 5C the output voltage of the first and second connecting nodes 605 and 606, FIG. 5D the output voltage of the XNOR gate 670, FIG. 5E the output voltage of the NOR gate 680, and FIG. 5F the level of the ATD signal 604.

The operation of an embodiment of the present invention will now be described with reference to FIGS. 5A through 5F.

The data line equalizing signal 603 in FIG. 3 is a signal enabled when an address signal makes a transition in ATD (not shown) as does the ATD signal 604. The sense amplifier 600 and the transfer transistors 650 and 660 are all enabled when the output 608 (E) of the NOR gate 680 is at the logic "low" state.

If the data line equalizing signal 603 (B) becomes the logic "low" state, the equalizing PMOS transistor 620 is turned on so as to equalize the pair of data lines 601 and 602 to the level of $\frac{1}{2}$·Vcc. The sense amplifier 600 senses and amplifies the voltage of the memory cells selected according to the transition of an address signal, and the data lines 601 and 602 are equalized for the next operation of the sense amplifier after generation of the first output thereof. This operation may be the same as that of the conventional memory.

If the data lines 601, 602 are equalized to the level of $\frac{1}{2}$·Vcc, the signals passing through the inverters 630 and 640 to the first and second connecting nodes 605 and 606 become the corrected logic "low" state, because the inverters 630 and 640 have the input trip level of the logic "high" state with respect to the level of $\frac{1}{2}$·Vcc.

If the voltages of the first and second connecting nodes 605 and 606 are at the logic "low" state, the output 607 (D) of the XNOR gate 670 becomes the logic "high" state as shown in FIGS. 4A and 4B. Then, the NOR gate 680 produces an output (E) of the logic "low" state applied to the sense amplifier 600 and the gates of the transfer transistors 650 and 660. Hence, the sense amplifier 600 is enabled to function, and the transfer transistors 650 and 660 connect the sense amplifier 600 and the data latch circuit 600. In this case, the data lines 601 and 602 (A) are equalized so as to put the output of the data latch circuit 700 in a floating state, so that the sense amplifier 600 is not affected by the noise induced by the I/O pad even if it is being operated during this time.

Thereafter, the data line equalizing signal 603 (B) becomes the logic "low" state so that the output of the sense amplifier 600 appears as an effective voltage signal in the data lines 601 and 602 (A). The signals passing the inverters 630 and 640 make the voltages of the first and second nodes 605 and 606 respectively the logic "high" and "low" states, or vice versa. Thus, the output 607 (D) of the XNOR gate 670 becomes the logic "low". At this time, the ATD signal 604 (F) is at the logic "low" state, and therefore, the output 608 (E) of the NOR gate 680 becomes the logic "high" state.

Since the ATD signal 604 (F) is a signal produced by sensing a state that an external address signal makes a transition in order to retrieve a data from a selected memory cell, it is disabled only during the lag between the end and start of the data output in the data lines 601, 602.

As a result, since the output 608 (E) of the NOR gate 680 is at the logic "high" state, the sense amplifier 600 and the transfer transistors 650 and 660 are disabled. Namely, as soon as the sense amplifier 600 produces the retrieved data, it is disabled as well as blocked from the output of the I/O pad due to the transfer transistors 650 and 660 being turned off. Meanwhile, when the transfer transistors 650 and 660 are turned off, the retrieved data has been already stored in the data latch circuit 700.

Further, the ATD signal 604 (F) is maintained at the logic "high" state if the address signal makes a transition in a retrieving cycle, which causes the output 608 (E) of the NOR gate 680 to be constantly in the logic "low" state. Thus, only until the output 607 (D) of the XNOR gate 670 is produced in view of the fact that the output of the sense amplifier 600 is the effective retrieved data, the sense amplifier is made affected by the I/O pad. Then, at the time when the output 607 (D) of the XNOR gate 670 senses the effective output data of the sense amplifier, it determines the output 608 (E) of the NOR gate 680 so as to properly control the output of the sense amplifier 600.

As stated above, the inventive circuit senses the effective output data of the sense amplifier so as to disable the sense amplifier and isolate the output of the sense amplifier from the final output terminal such as the I/O pad, thus minimizing the power consumption of the sense amplifier and preventing the noise induced by I/O pad, etc.

What is claimed is:

1. A circuit for controlling the output of a sense amplifier in a semiconductor memory having a sense amplifier for sensing and amplifying the data retrieved from a selected memory cell, and I/O pad and a data latch circuit connected to the I/O pad, comprising:

sense amplifier output detection means for detecting the state of data pairs output from the sense amplifier;

control signal generating means for receiving an address transition detection signal and the output of the sense amplifier output detection means to generate a control signal; and transfer means connected between the sense amplifier and the data latch circuit, for responding to the output of the control signal generating means;

whereby the output of the control signal generating means is fed back to the sense amplifier.

2. The circuit for controlling the output of a sense amplifier as claimed in claim 1, wherein said sense amplifier output detection means produces a signal to simultaneously disable said sense amplifier and said transfer means when a pair of data outputs of the sense amplifier have different logic states.

3. The circuit for controlling the output of a sense amplifier as claimed in claim 1, wherein said sense amplifier output detection means is an exclusive NOR gate for receiving said data output pair.

4. The circuit for controlling the output of a sense amplifier as claimed in claim 1, wherein said control signal generating means is a NOR gate for receiving the output of said sense amplifier output means and the address transition detection signal.

5. The circuit for controlling the output of a sense amplifier as claimed in claim 2, wherein said sense amplifier output detection means is an exclusive NOR gate for receiving said data output pair.

6. A circuit for controlling the output of a sense amplifier, comprising:
   sense amplifier output detection means for providing an intermediate signal by detecting the state of data pairs from a sense amplifier;
   control signal generating means for receiving an address transition detection signal and the intermediate signal of the sense amplifier output detection means to generate a control signal;
   transfer means connected between the sense amplifier and a data latch circuit, for generating output signals in response to the control signal from the control signal generating means; and
   means for feeding the control signals back to the sense amplifier.

7. The circuit for controlling the output of a sense amplifier as claimed in claim 6, further comprised of said sense amplifier output detection means generating a signal to simultaneously disable the sense amplifier and said transfer means when said data pairs have different logic states.

8. The circuit for controlling the output of a sense amplifier as claimed in claim 6, wherein said sense amplifier output detection means is an exclusive NOR gate for receiving said data output pair.

9. The circuit for controlling the output of a sense amplifier as claimed in claim 7, wherein said sense amplifier output detection means is an exclusive NOR gate for receiving said data output pair.

10. The circuit for controlling the output of a sense amplifier as claimed in claim 6, wherein said control signal generating means is a NOR gate for receiving the output of said sense amplifier output means and an address transition detection signal.

11. The circuit for controlling the output of a sense amplifier as claimed in claim 1, wherein said sense amplifier output detection means enables said sense amplifier and said transfer means whenever said state of data pairs from said sense amplifier is equal.

12. The circuit for controlling the output of a sense amplifier as claimed in claim 1, wherein said sense amplifier output detection means simultaneously disables said sense amplifier and said transfer means only when said data pairs have different states.

13. The circuit for controlling the output of a sense amplifier as claimed in claim 6, further comprised of said sense amplifier output detection means generating a signal to enable said sense amplifier and said transfer means whenever said data pairs have the same logic states.

14. The circuit for controlling the output of a sense amplifier as claimed in claim 6, further comprised of said sense amplifier output detection means generating a signal to simultaneously disable said sense amplifier and said transfer means only when said data pairs have different logic states.

15. A circuit for optimizing output signals of a sense amplifier provided in a pair of data lines, comprising:
   first transistor means interposed between first and second data lines and coupled to receive said output signals provided from said first and second data lines, for equalizing voltage potentials of said first and second data lines in dependence upon reception of an equalizing signal;
   inverter means coupled to receive said output signals, for inverting said output signals to provide first and second inverted signals for said first and second data lines;
   first gate means coupled to receive said first and second inverted signals, for providing an intermediate signal in dependence upon reception of said first and second inverted signals;
   second gate means coupled to receive said intermediate signal and an address transition detection signal, for providing a control signal in dependence upon reception of said intermediate signal and said address transition detection signal, and for feeding said control signal back to said sense amplifier for controlling generation of said output signals provided in said first and second data lines; and
   second transistor means coupled to receive said first and second inverted signal, for providing optimized output signals in response to said control signal.

16. The circuit for optimizing output signals of a sense amplifier as claimed in claim 15, wherein said first transistor means is a PMOS transistor having a gate coupled to receive said equalizing signal.

17. The circuit for optimizing output signals of a sense amplifier as claimed in claim 15, wherein said first gate means is an exclusive NOR gate and said second gate means is a NOR gate.

18. The circuit for optimizing output signals of a sense amplifier as claimed in claim 15, wherein said second transistor means comprises first and second PMOS transistors having each respective gate electrodes coupled to receive said control signal.

* * * * *

UNITED STATES PATENT AND TRADEMARK OFFICE
CERTIFICATE OF CORRECTION

PATENT NO. : 5,160,861
DATED : 3 November 1992
INVENTOR(S) : Jeong-Woo LEE

It is certified that error appears in the above-indentified patent and that said Letters Patent is hereby corrected as shown below:

Column 1,   Line 51,   after "signal", delete comma " , ",

Column 4,   Line 45,   before "I/O", change "and" to --an--.

Signed and Sealed this

Sixth Day of August, 1996

Attest:

BRUCE LEHMAN

*Attesting Officer*    *Commissioner of Patents and Trademarks*